United States Patent [19]

Richardson et al.

[11] Patent Number: 4,596,046
[45] Date of Patent: Jun. 17, 1986

[54] SPLIT LOOP AFC SYSTEM FOR A SSB RECEIVER

[75] Inventors: Julian H. Richardson, Clevedon, England; Bruce C. Eastmond, Downers Grove, Ill.

[73] Assignee: Motorola, Inc., Schaumburg, Ill.

[21] Appl. No.: 656,551

[22] Filed: Oct. 1, 1984

[51] Int. Cl.[4] .............................................. H04B 1/26
[52] U.S. Cl. ..................................... 455/260; 455/35; 455/203; 455/265
[58] Field of Search ................... 455/35, 47, 202, 203, 455/208, 260, 265, 182, 183, 192; 329/122, 124; 331/12, DIG. 2, 2

[56] References Cited

U.S. PATENT DOCUMENTS

| | | | |
|---|---|---|---|
| 3,358,234 | 12/1967 | Stover | 455/203 |
| 3,675,131 | 7/1972 | Pickholtz . | |
| 3,909,735 | 9/1975 | Anderson et al. | 329/122 |
| 3,984,778 | 10/1976 | Bhopale . | |
| 4,009,442 | 2/1977 | von Bromssen . | |
| 4,135,164 | 1/1979 | Kurata . | |
| 4,211,975 | 7/1980 | Kuroda . | |
| 4,243,941 | 1/1981 | Zdunek | 455/260 |
| 4,313,211 | 1/1982 | Leland . | |
| 4,336,616 | 6/1982 | Frosch . | |
| 4,399,560 | 8/1983 | Watkinson | 455/260 |
| 4,539,707 | 9/1985 | Jacobs et al. | 455/203 |

OTHER PUBLICATIONS

"Improving Spectrum Efficiency with ASCB", by Jacobs, Communications Magazine, pp. 34–44, Mar. 1981.
"Elimination of False-Locking and Long Loop Phase--Locked Receivers", by McGeehan et al., IEEE Trans. on Comm., pp. 2391–2397, Oct. 1982.
"The Potential of SSB for Land Mobile Radio", by Gibson et al., 29th IEEE Conference of Vehicle Technology, pp. 90–94, Mar. 1979.
"Impairment Mechanisms for SSB Mobile Communications at UHF with Pilot Based Doppler/Fading Correction", Leland et al., BSTJ, vol. 59, No. 10, pp. 1923–1942, Dec. 1980.
"The Application of Single Side Band Modulation in the 450 Megahertz and 960 Megahertz Land Mobile Radio Bands", Wells International Conf. on Land Mobil Radio, pp. 291–298, Sep. 1979.
"Problem of Speech Pulling and its Implementation for the Design of Phase-Locked SSB Radio Systems", McGeehan et al., IEEE Proceedings, vol. 128, No. 6, pp. 361–369, Nov. 1981.
"Theoretical and Experimental Investigation of Feed Forward Signal Regeneration as a Means of Combating Multi Path Propagation Effects in Pilot-Based SSB Mobile Radio Systems", McGeehan et al., IEEE Trends of Vehicle Technology, vol. VT-23, No. 1, Feb. 1983.

Primary Examiner—Jin F. Ng
Attorney, Agent, or Firm—Donald B. Southard; Thomas G. Berry

[57] ABSTRACT

An automatic frequency control circuit for a single side band receiver employing a split-loop phase locked loop system is disclosed. Initially, both a first and second voltage controlled oscillator lock to a received pilot taken after the IF strip of the SSB receiver. Once lock is achieved, a sample is taken of the control line voltage of the first VCO whereafter the first VCO control line is held at the sampled voltage and will no longer track the received pilot until such time as the second VCO deviates from a predetermined range. Simultaneous to switching the first VCO, the loop filter of the second VCO is adapted to maintain identical loop dynamics both before and after switching control of the first VCO.

11 Claims, 6 Drawing Figures

SPLIT LOOP AFC SYSTEM FOR A SSB RECEIVER

BACKGROUND OF THE INVENTION

This invention relates generally to radio frequency control systems and more particularly to automatic frequency control (AFC) systems for single sideband receivers and still more particularly to split loop AFC systems to be used at frequencies designated for land mobile services.

It is well known by those skilled in the art that the tolerable frequency error, without significant loss of voice recognition or intelligibility, is approximately ±20 Hz in a single sideband radio system. Traditional means of controlling radio frequencies such as crystal frequency standards cannot alone maintain this close tolerance at frequencies greater than approximately 20 MHz. Typical crystal oscillator performance over the temperature extremes encountered in a mobile radio environment range from ±5 parts per million (ppm) to ±1 ppm. The cost of the ±1 ppm oscillator is inherently much greater than that of a ±5 ppm oscillator. Considering a UHF frequency of 860 MHz, these tolerances yield frequency errors of ±4.3 kHz and ±860 Hz respectfully.

To resolve this frequency tolerance problem a pilot signal, which is generally employed by the receiver to eliminate the frequency errors introduced by the crystal oscillators, may be transmitted with the single sideband signal. Typically, the receiver AFC employs a phase locked loop (PLL) which locks to the pilot signal. Various continuous PLL techniques have been widely adopted among single sideband receiver designers. Generally, PLL receiver AFC circuits are realized in a loop that includes a mixer, an intermediate frequency (IF) filter and gain, phase detector with associated reference oscillator, a loop filter, and a voltage controlled oscillator (VCO) which accepts a frequency control voltage from the loop filter and produces a local oscillator (LO) signal for the mixer.

When the VCO controlled by the phase lock loop is realized in a first (pre-IF) mixer of an SSB receiver the technique is generally known, among those skilled in the art, as a long loop AFC system. While long loop AFC systems are a contribution to the art they do, however, suffer phase lock dropouts due predominately to noise on the VCO control line often caused by fading of the received signal. A further deficiency of long loop AFC systems is the excessive pull-in times required to accomplish phase lock. This delay, primarily induced through the IF strip filtering, may produce undesirable effects and partial loss of the recovered signal.

Many single sideband receiver designers have utilized a technique of positioning the VCO controlled by the phase detector after the IF strip to eliminate the excessive pull-in times of a long loop AFC system. While this so called short loop provides very rapid pull-in times to accomplish phase lock it is not without drawbacks. Paramount among these drawbacks is the effect of sideband cutting wherein the intelligible information transmitted is partially lost in the IF filter if the received signal is not exactly centered in the IF passband.

Various permutations of long and short loop AFC systems have become known in the art and include dual or multiple bandwidth AFC systems. To eliminate noise on the VCO control line which may cause PLL dropouts, loop filters with selectible transfer functions were incorporated to narrow the bandwidth of the loop as the VCO closed in on the desired frequency. However, the multiple bandwidth phase lock loop systems may have further shortcomings such as poor demodulator performance when the received signal is subject to multipath signal propagation or inferior acquisition performance.

Attempting to resolve these conflicting deficiencies of the above described PLL AFC systems, McGeehan, J. P., and Sladen, J. P. introduced in a paper entitled "Elimination of False-Locking in Long Loop Phase-Lock Receivers" IEEE Trans. on Comm., pages 2391–2397 October, 1982, a split loop AFC system. The split loop AFC system, a hybrid of the long and short loop AFC systems, attempts to incorporate into one system the advantages described above for each of the independent systems. In VCO's, a first prior to the IF strip and a second following the IF strip. The first VCO provides the centering to eliminate sideband cutting that may be experienced in the short loop AFC systems, and the second PLL obtains rapid lock time by avoiding the delay through the IF filters. While the split loop AFC system is a significant advance in the art and does in fact incorporate certain advantages of the prior long and short loop AFC systems, there remain shortcomings common to all continuous phase locked loop AFC systems in general. One such problem is described by McGeehan, J. P. in a paper entitled "Problem of Speech Pulling and its Implementation for the Design of Phase-Locked SSB Radio Systems" IEE Proceedings Volume 128, No. 6 pages 361–369 November, 1981. In this article McGeehan describes phase locked loop false locking, and VCO variations due to speech information getting into the phase locked loop and attempting to pull the VCO off the desired frequency. In various implementations of SSB receivers the effects of speech pulling manifest themselves differently. For example, a tone-in-band SSB system may experience a form of intermodulation distortion, and pilot-carrier systems may see the effect of speech pulling emerging as a form of harmonic distortion.

The present invention discloses a method of solving the split loop shortcomings and enabling single sideband receivers to approach the performance of well established frequency modulation receivers.

SUMMARY OF THE INVENTION

The embodiment of this improvement is to hold the frequency of the first VCO constant once phase lock is established thereby removing speech pulling effects from the VCO control line. Further, as the first VCO is held locked to the received pilot-carrier noise considerations in the first VCO are eliminated. Also, by holding the frequency of the first VCO after lock is established, the sideband cutting phenomena need not be considered as the signal was automatically centered to the IF filter passband prior to the lock condition being established. Contemporaneous to holding the first VCO frequency constant the loop filter of the second VCO is adapted such that the overall effect of loop dynamics in the now short loop second VCO is unchanged, thereby avoiding the detrimental effects experienced in multiple bandwidth PLL systems described above.

Therefore, it is an object of the present invention to provide an adaptable phase locked loop AFC system incorporating the benefits of a split loop AFC system and a short loop AFC system having identical loop dynamics.

It is a further object of the present invention to provide an AFC system of the foregoing type which effectively avoids PLL drop-out effects.

It is yet a further object of the present invention to provide a split loop AFC system for a single sideband receiver which overcomes the abovementioned deficiencies of short and long loop AFC systems.

Accordingly, these and other objects are achieved in the present automatic frequency control system for a single sideband receiver.

BRIEF DESCRIPTION OF THE DRAWINGS

The features of the present invention which are believed to be novel are set forth with particularity in the appended claims. The invention, together with further objects and advantages thereof, may be understood by reference to the following description taken in conjunction with the accompanying drawings, and the several figures of which like referenced numerals identify like elements, and in which:

DETAILED DESCRIPTION OF THE PREFERRED EMBODIMENT

Figure 1:
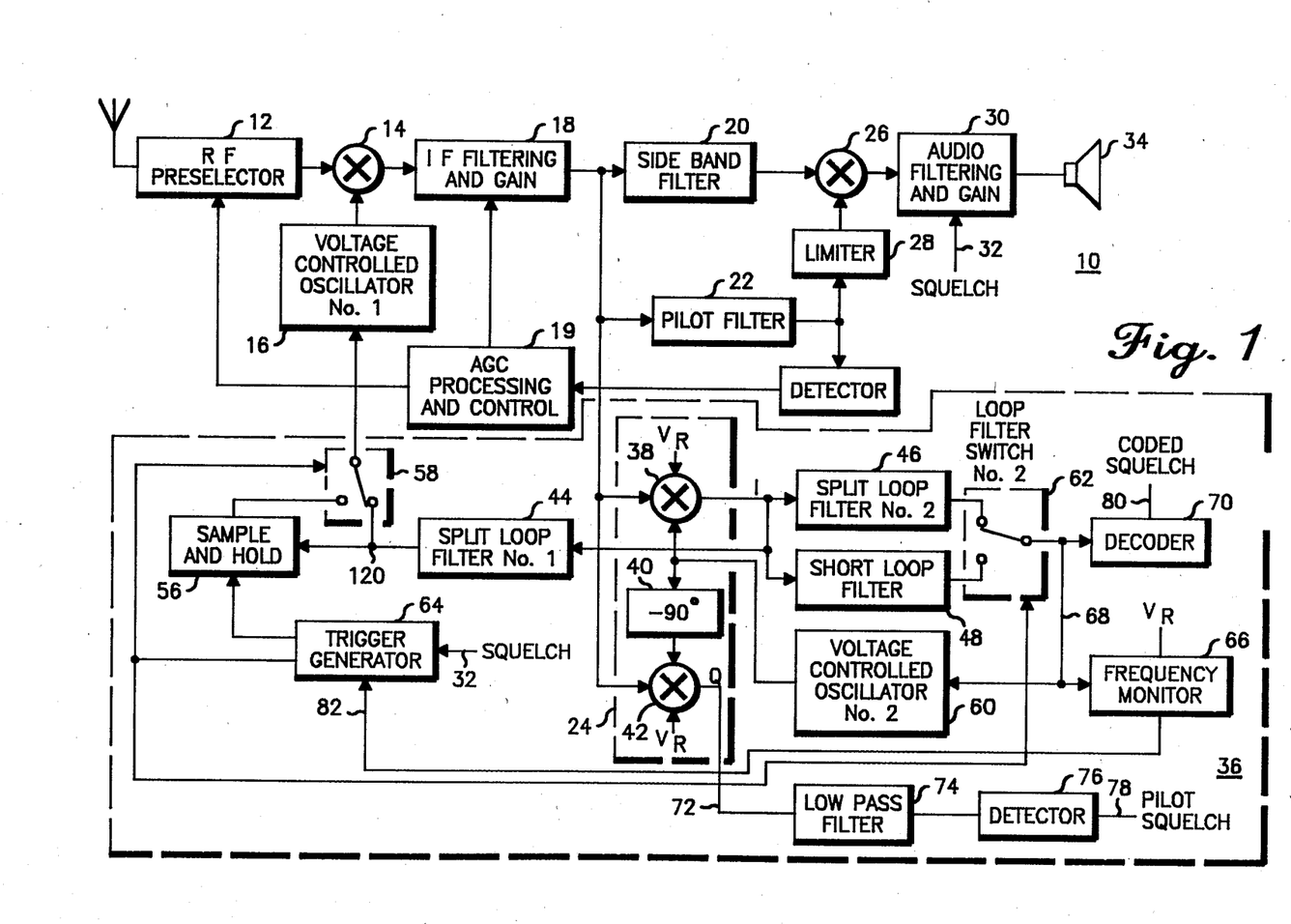
FIG. 1 is a block diagram of a single sideband receiver employing an AFC scheme following the teachings of the present invention.

Referring now to FIG. 1, a single sideband receiver 10 employing the automatic frequency control (AFC) system described by the present invention is depicted in block diagram form. A receiver of this type may be used to receive signals broadcast in the 800–900 MHz range.

In general, a narrow portion of the available frequency spectrum is selected by RF preselector 12 and presented to mixer 14 having as a second input a signal from a first VCO 16. Mixer 14 translates the received signal in frequency and presents this signal to the IF filtering and gain stage 18 which further filters the received signal, which may include both speech and a pilot-carrier, to reduce noise and delivers this signal to a plurality of locations including sideband filter 20, pilot filter 22 and phase detector 24. When the received signal first appears within the IF bandwidth of the SSB receiver 10, it may be momentarily at a level higher than the steady-state level it will attain when the AGC circuit 19 reduces the receiver gain in the well known AGC operation.

Sideband filter 20 removes the intelligible portion of the transmitted signal and applies it to mixer 26. A second input to mixer 26 is the amplitude limited pilot-carrier which has been selected from the frequency spectrum through pilot filter 22 and limited by limiter 28. Mixer 26 now applies the recovered intelligible signal to audio filtering and gain stage 30, which is further controlled by a squelch input 32 the origin of which will be described hereinafter in greater detail. Lastly, the recovered signal is applied to speaker 34 which presents the operator with the transmitted information.

Figure 2:
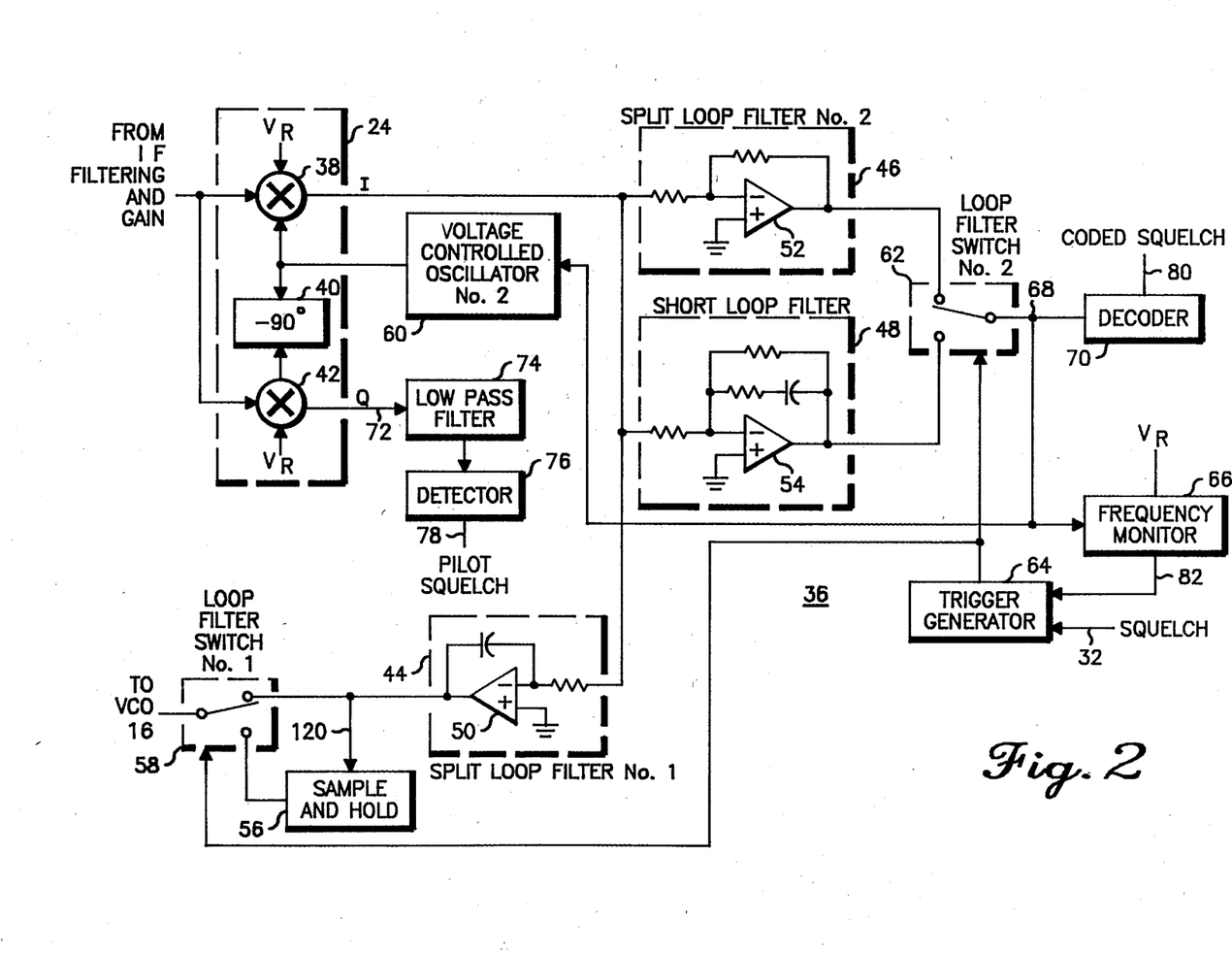
FIG. 2 is a semi-block, semi-schematic drawing of the AFC system of FIG. 1.

Referring now to FIG. 2, which presents AFC 36 in semi-block, semi-schematic form extracted from single sideband receiver 10. Entering the AFC circuit 36 a signal is introduced from IF filtering and gain stage 18 to phase detector 24. Phase detector 24, having both an in-phase (I) and a quadrature (Q) output, has a second input in the form of VCO 60. VCO 60 is mixed with the incoming pilot-carrier from IF filter and gain stage 18 in the in-phase phase comparator 38 which has reference voltage $V_R$ whose origin will be hereinafter discussed in greater detail. Further, phase detector 24 has the signal from VCO 60 phase compared in quadrature to the received pilot-carrier in phase comparator 42 through phase shifter 40. The in-phase output signal from phase comparator 24 is applied to a plurality of locations. In particular, this signal is applied to a first split loop filter 44, a second split loop filter 46 and a short loop filter 48. The first split loop filter 44, which is one of the two possible control means of VCO 16, comprises operational amplifier 50, with associated circuitry, producing a loop filter having a specified transfer function. A second control means to VCO 16 is sample and hold circuit 56 which will be discussed hereinafter in greater detail. The first split loop filter 44 and sample and hold circuit 56 may control VCO 16 depending upon the position of a first loop filter switch 58. A complete functional description, including timing, is forthcoming in more specific detail.

Controlling the second VCO 60 is one of two possible control means. A first control means is a second split loop filter 46 comprising operational amplifier 52 and associated circuitry, providing a loop filter having a specified transfer function. The alternative control means of a second VCO 60 is short loop filter 48 comprising operational amplifier 54, and associated circuitry, having a specified transfer function such that when control is switched through first and second loop filter switches 58 and 62 respectively, the overall loop dynamics remain unchanged.

Controlling the selection of control means of both the first VCO 16 and the second VCO 60 is trigger generator 64. Trigger generator 64, having both an input from frequency monitor 66 and squelch input 32, provides an enabling signal to loop filter switches 58 and 62 thereby controlling which means is utilized to control both the first and second VCO's.

The second VCO control line 68, derived from the output of either the second split loop filter 46 or the short loop filter 48, is applied to a plurality of locations including frequency monitor 66, decoder 70, whose circuitry will detect any "coded squelch" information that may be used in the overall single sideband transceiver scheme, and, of course, VCO 60.

The Q, or quadrature output 72 of phase detector 24 is applied to low pass filter 74 to remove or limit any high frequency components which may yet be present on the signal. After filtering, the quadrature signal 72 is then applied to detector 76 whose output is "pilot squelch" signal 78 which may be used to indicate the successful capture of a pilot signal which may be transmitted in the overall single sideband transceiver scheme.

Squelch signal 32 is suitably derived from AFC circuit 36 employing either coded squelch signal 80 or pilot squelch signal 78 or the logical ANDing of both coded squelch 80 and pilot squelch 78. It will be understood by those skilled in the art that any of the above described squelch signals, or other suitable combinations of these signals, may be employed in a receiver to perform conventional squelch application functions.

Referring again to FIG. 1, in conjunction with FIG. 2, the overall functionality of AFC system 36 may now be described. As a received signal is captured and supplied from IF filter and gain stage 18 to phase detector 24 both first and second VCO's 16 and 60 are controlled respectively by a first control means comprising split loop filter 44 and a second split loop filter 46. Both VCO's initially track and lock to the received pilot carrier transmitted from the transmitter. As the first VCO 16 tracks the received pilot carrier through split loop filter 44 the pilot tone and intelligible information is automatically centered in IF filter and gain stage 18 through mixer 14. Simultaneously, as VCO 60 nears the frequency of the transmitter pilot carrier, frequency monitoring means 66, which has been monitoring second VCO control line 68, asserts its output signal to trigger generator 64 indicating that VCO 60 has entered a predetermined range of allowable frequency deviation from the pilot-carrier.

Although the generic term "voltage controlled oscillator" (VCO) is used throughout this description, it will be well understood, by those skilled in the art, that a crystal controlled VCO (VXCO) may be readily substituted. Indeed, those skilled in the art will appreciate that depending on required performance, VXCO's may be desirable over standard VCO's.

The function of Decoder 70 is to extract any coded squelch information from control line 68 which may be present and assert signal 80 when such information has been detected. As previously described, coded squelch signal 80 either singularly or logically combined with pilot squelch 78 may cause squelch signal 32 to assert. Trigger generator 64, now having both squelch signal 32 and frequency monitor output 82 asserted, will initiate a trigger signal to sample and hold circuit 56. Sample and hold 56, comprising both a means of monitoring the first split loop filter 44 and a holding means to maintain that signal voltage until a next sample is taken, responds in the conventional sample and hold circuit operation.

Trigger generator 64 also produces an output signal which controls both first and second loop filter switches 58 and 62, switching control means of both VCO's 16 and 60 to their respective second control means when asserted. The effect on VCO 16 is that control is now maintained by the last held value of loop filter 44. Thus, VCO 16 is no longer tracking the received pilot-carrier, but is held constant. The now constant first VCO 16 is free of noise considerations that may cause PLL dropouts and previously described speech pulling problems. The second VCO 60 is likewise controlled by its second control means, short loop filter 48, whose transfer function is such that the dynamics of the loop as seen by VCO 60 remains unchanged, thereby escaping the previously described detriments of multiple bandwidth systems. The now short loop AFC configuration will be maintained until such time as either frequency monitoring means 66 negates its signal to trigger generator 64, indicating that a carrier fade or co-channel interference is now present, or squelch signal 32 negates indicating that either transmission has ceased or some obstruction has occurred causing the transmitted signal to become obscured. If either of the two conditions described above occurs, either independently or in logical combination, the entire pilot-carrier tracking and phase locking sequence together with the split loop to short loop conversion will be reinitiated.

Figure 3:
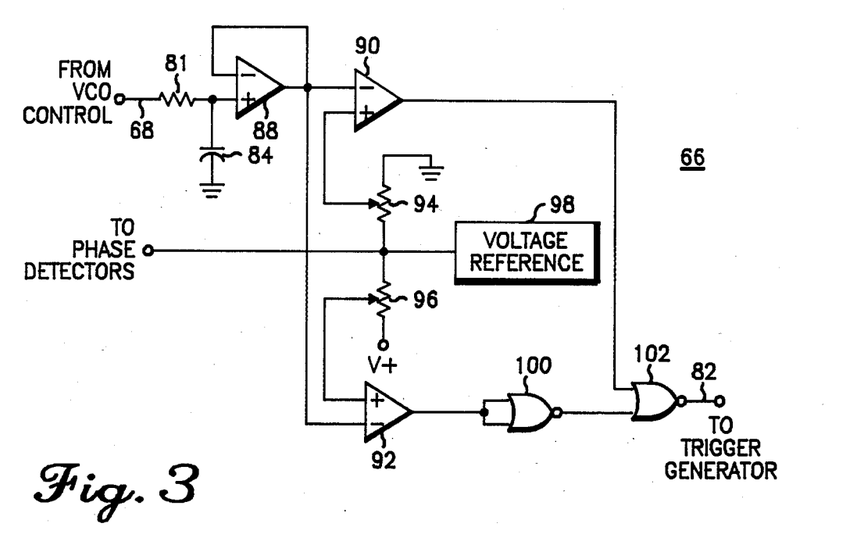
FIG. 3 is a detailed schematic diagram exemplifying the preferred embodiment of the frequency monitoring means.

Referring now to FIG. 3, a detailed schematic diagram of frequency monitoring means 66 may be inspected. VCO control line 68 is initially filtered by resistor 81 and capacitor 84 forming a suitable low pass filter to further remove any high frequency components which may be present on control line 68. The now filtered control line voltage is applied to operational amplifier 88 which buffers the signal and applies it to comparators 90 and 92. Comparator reference voltages are applied to the positive inputs of comparator 90 and 92 through variable resistors 94 and 96 respectively. These comparator references are derived from a standard reference 98, which is also the source of the voltage references $V_R$ for phase comparators 38 and 42, and is widely available in the industry from various manufacturers at a variety of voltage levels. Comparators 90 and 92 together with variable resisters 94 and 96 and voltage reference 98 comprise a "window" detector that causes a change-of-state on NOR gate 102 whenever the output signal of operational amplifier 88 deviates from the voltage limits set up by variable resistors 94 and 96. The output signal of comparator 92 is inverted and applied to NOR gate 102 together with the output signal of comparator 90. The inversion of the output signal from the comparator 92 may be done in a variety of ways known to those skilled in the art, however, in this exemplary embodiment the inversion is effected by using NOR gate 100 configured to be an inverter since NOR gates are already available in the integrated circuit package that contains NOR gate 102. Output 82 of NOR gate 102 is then applied to the trigger generator 64 and is asserted to indicate that VCO 60 is substantially "on-frequency".

Figure 4:
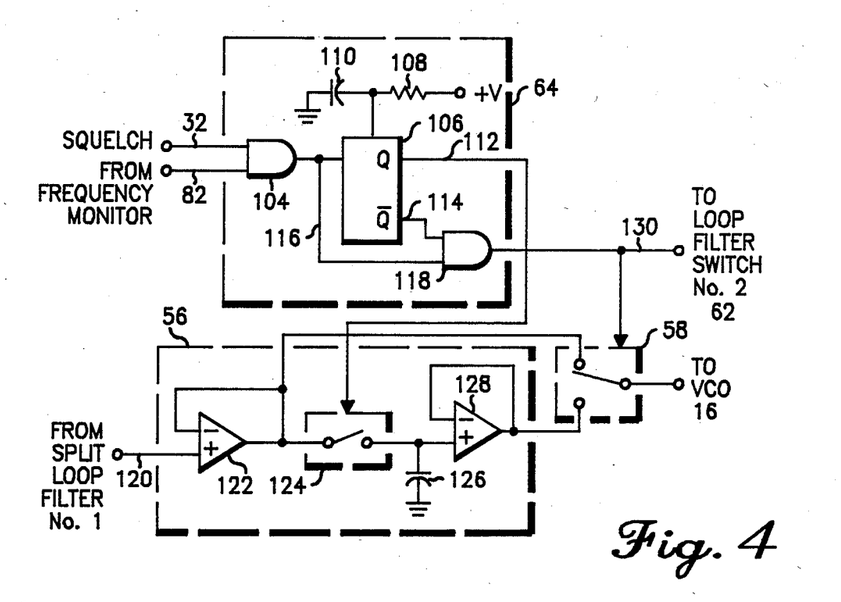
FIG. 4 is a detailed schematic diagram exemplifying the preferred embodiment of the trigger generator and sample and hold circuit.

Referring now to FIG. 4, a detailed schematic diagram is shown of both trigger generator 64 and sample and hold circuit 56. As previously described, trigger generator 64 has an input 32 from any suitable squelch circuitry and signal 82 from previously described frequency monitor 66. These signals are ANDed together via AND gate 104 and applied to positive edge triggered monostable 106. Positive edge triggered monostable 106 is widely available, such as, for example, Motorola, Inc. part MC14528B. When the output of AND gate 104 is asserted, output 112 of monostable 106 also asserts applying a signal to sample and hold circuit 56 indicating that a sample of the signal of split loop filter 44 should be taken through connection 120. The 112 output is held asserted by monostable 106 for a period of time specified by the time constant formed by resistor 108 and capacitor 110, determined by the value of these two components, which may be selected to be any suitable time period to affect a rapid and reasonable estimation of split loop filter 44. After the specified time period lapses, signal 112 negates and output 114 of monostable 106 asserts. This signal and the output of AND gate 104 are ANDed together in AND gate 118 providing a control signal which indicates to loop filters 58 and 62 that a change of VCO control means is to be effected. AND gate 118 and 104 may be, for example, provided as Motorola, Inc. MC14081B.

When output 112 of monostable 106 asserts, sample and hold circuit 56 is triggered into action. While sample and hold circuit 56 is continually monitoring the output of split loop filter 44, through operational amplifier 122, it is not until triggered that sample switch 124 closes causing a sample to be held. Sample switch 124 may be any suitable switch such as an FET, or transmission gate, as well known in the art. Once closed, sample switch 124 passes the signal from operational amplifier 122 to capacitor 126 which begins charging to the value of loop filter 44. After the predetermined time interval has elapsed, sample switch 124 opens thereby preventing any further charging of capacitor 126 which, denied a discharge path, will hold the voltage value until such time as a next sample is taken. This held voltage is applied to operational amplifier 128 which is configured as a voltage follower to present the signal to loop filter switch 58 as an alternative control means for VCO 16.

Figure 5:
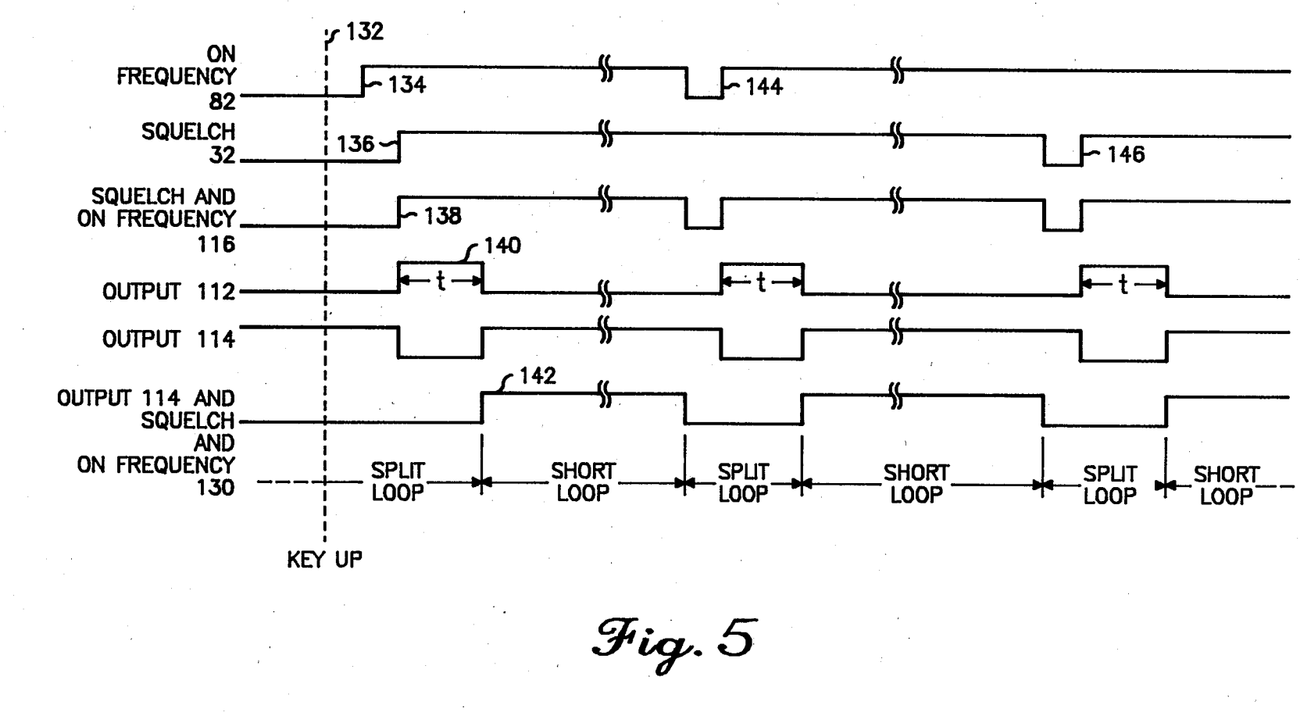
FIG. 5 is a graphic representation of a timing diagram depicting the operational conversion between the split loop and short loop configurations of the present invention.

Referring now to FIG. 5, the overall timing of the AFC system is graphically depicted. As the transmitter is keyed up such as shown at 132, the signal is received by the single sideband receiver 10. Shortly thereafter, on-frequency signal 82 asserts at 134, and squelch signal 32 asserts at 136. Essentially simultaneously, neglecting gate delays, the logically ANDed squelch and on-frequency signal 116 asserts at 138. The assertion of signal 116 causes output 112 of monostable 106 to assert and remain in that state for a specified period of time as represented at 140. As signal 112 negates and the signal 130 asserts at 142 which, ANDed with signal 116, represents the controlling signal to both loop filter switches 58 and 62. Thus, in a single sideband receiver a received pilot-carrier taken after the IF is locked onto, and after phase lock is achieved the AFC system is modified to both hold the first VCO 16 at a constant signal while simultaneously adapting the second VCO 60 loop filter to maintain identical loop dynamics.

If after some time on-frequency signal 82 should negate and later reassert, such as indicated at 144, for example, the entire lock and hold sequence is repeated. Further, as seen in FIG. 5, if for any reason the squelch signal 32 should negate and later reassert, as indicated at 146, again the entire lock and hold sequence is repeated. Thus a method is disclosed to provide an improved AFC system for a single sideband radio combining the advantages of both the split loop and short loop PLL configurations.

As described above sample and hold circuit 56 was implemented using analog technology. However, in many receivers, particularly those employing a coded squelch implementation, microprocessors and other forms of digital technology are readily available.

Figure 6:
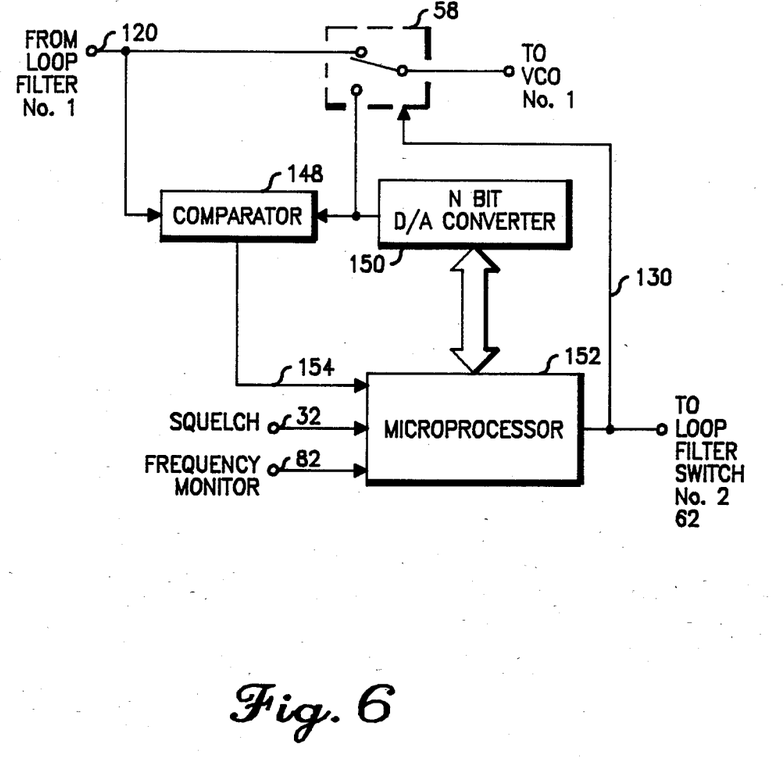
FIG. 6 is an exemplary block diagram depicting an embodiment of an alternative sample and hold circuit utilizing digital technology.

Referring now to FIG. 6, a digital technology version of sample and hold circuit 56 is shown in an exemplary block diagram. As previously described, comparator 148 continually monitors the signal from loop filter 44 through connection 120. When both squelch signal 32 and on-frequency signal 82 assert, microprocessor 152 programs the n bit D/A converter 150 to begin an up-count. This up-count generates a ramp type voltage which is supplied to comparator 148 to be compared to the signal from split loop filter 44. As this ramp voltage just exceeds the level of loop filter 44, the comparator asserts signal 154 indicating to microprocessor 152 that the D/A converter has now essentially obtained an identical voltage level. Microprocessor 152 thereafter asserts signal 130, which controls both loop filter switches 58 and 62, thereby converting the control of VCO 16 from split loop filter 44 to the output of the n bit D/A converter 150. Thus in digital technology an equivalent sample and hold circuit for controlling VCO 16 is described.

While a particular embodiment of the invention has been described and shown, it should be understood that the invention is not limited thereto since many modifications may be made. It is therefore contemplated to cover by the present application any and all such modifications that may fall within the true spirit and scope of the basic underlying principles disclosed and claimed herein.

What is claimed is:

1. An improved split loop automatic frequency control system for a single sideband receiver operating on a received pilot with squelch activation information, said system comprising in combination;
   a split phase locked loop comprising
   a first and second voltage controlled oscillator each having a first and second control means for loop control;
   means for locking said first and second voltage controlled oscillator to said received pilot each using said first control means;
   means for generating a first control signal whenever said second voltage controlled oscillator resides in a specified range of said pilot;
   means for detecting transmitted squelch activation information and generating a second control signal therefrom;
   means responsive to the presence of said first and second control signals to connect said first and second voltage controlled oscillators to the respective second control means and reestablish connection thereof to the respective first control means upon the absence of either said first or second control signals.

2. An improved split loop automatic frequency control system as described in claim 1, wherein said first control means of said first voltage controlled oscillator comprises a split loop PLL filter having a specified transfer function.

3. An improved split loop automatic frequency control system as described in claim 1, wherein said second control means of said first voltage controlled oscillator comprises monitoring means to sample said first control means of said first VCO, for a specified period of time, whenever triggered.

4. An improved split loop automatic frequency control system as described in claim 3, wherein said second control means of said first voltage controlled oscillator comprises holding means to continuously hold the value of said monitoring means until a next sample is taken.

5. An improved split loop automatic frequency control system as described in claim 1, wherein said first control means of said second voltage controlled oscillator comprises a split loop PLL filter having a specified transfer function.

6. An improved split loop automatic frequency control system as described in claim 1, wherein said second control means of said second voltage control oscillator comprises a loop filter having a specified transfer function.

7. An improved split loop automatic frequency control system as described in claim 1, wherein said first control signal generating means comprises a frequency monitoring means having a filtering means to continually average an input signal to said second voltage controlled oscillator.

8. An improved split loop automatic frequency control system as described in claim 7, wherein said frequency monitoring means further comprises at least one voltage reference of a specified value.

9. An improved split loop automatic control system as described in claim 8, wherein said frequency monitoring means further comprises comparator means to compare the instantaneous value of said voltage reference to said average value of said input signal of said second voltage controlled oscillator, generating said first control signal whenever said average value of said input signal deviates from a specified range of said instantaneous value of said voltage reference.

10. A method for automatically controlling the frequency of a single sideband receiver operating on a received pilot with squelch activation information, said receiver employing a split phase locked loop comprising a first and second voltage controlled oscillator each having a first and second control means for loop control and means for detecting said transmitted squelch activation information, comprising the steps of:

locking said first and second voltage controlled oscillators to the respective first control means;
  generating a first control signal whenever said squelch activation information is detected;
  generating a second control signal whenever said second voltage controlled oscillator is in a specified range of said pilot;
  connecting said first and second voltage controlled oscillators to the respective second control means in response to the presence of said first and second control signals and reestablishing connection thereof to the respective first control means upon the absence of either said first or second control signals.

11. A method for automatically controlling the frequency of a single sideband receiver operating on a received pilot with squelch activation information, said receiver employing a split phase locked loop comprising a first voltage controlled oscillator having a loop filter as a first control means and a sample and hold circuit for a second control means, and a second voltage controlled oscillator having as a first control means a loop filter having a specified transfer function and a second control means comprising a loop filter having a specified transfer function, and said receiver having means for detecting said transmitted squelch activation information, comprising the steps of:

generating a first control signal whenever said second voltage controlled oscillator is within a specified range of said pilot;
  generating a second control signal whenever said squelch activation information is detected;
  generating a trigger signal in response to said first and second control signals;
  generating a trigger pulse with a specified time duration in response to said trigger signal;
  sampling said loop filter of the first voltage controlled oscillator in response to said trigger pulse to provide a sampled value;
  holding said sampled value until a next sampling occurrence;
  generating a third control signal in response to said trigger signal and a signal indicating the specific time duration of said trigger pulse has expired;
  switching said first and second voltage controlled oscillators to said second control means in response to said third control signal, and switching back to said first control means in the absence of said third control signal.

* * * * *